United States Patent [19]

Wilkinson et al.

[11] Patent Number: 4,751,106
[45] Date of Patent: Jun. 14, 1988

[54] METAL PLATING PROCESS

[75] Inventors: Gary M. Wilkinson, Kenilworth; Cheryl A. Deckert, Warwick, both of England; Jeffrey J. Doubrava, Upton, Mass.

[73] Assignee: Shipley Company Inc., Newton, Mass.

[21] Appl. No.: 911,453

[22] Filed: Sep. 25, 1986

[51] Int. Cl.⁴ .............................................. B05D 5/12
[52] U.S. Cl. ........................................ 427/98; 427/97; 427/443.1
[58] Field of Search ................. 427/97, 98, 443.1; 106/1.23

[56] References Cited

U.S. PATENT DOCUMENTS

| | | | |
|---|---|---|---|
| 3,011,920 | 12/1961 | Shipley, Jr. | 427/98 |
| 3,615,736 | 10/1971 | Stone . | |
| 4,001,470 | 1/1977 | Schulze-Berger | 427/304 |
| 4,419,183 | 12/1983 | Gulla | 427/309 |
| 4,450,191 | 5/1984 | Arcilesi | 427/437 |
| 4,481,236 | 11/1984 | Forsterling | 427/98 |
| 4,515,829 | 5/1985 | Deckert | 427/97 |
| 4,554,182 | 11/1985 | Bapp | 427/98 |

FOREIGN PATENT DOCUMENTS

| | | | |
|---|---|---|---|
| 51-78743 | 7/1976 | Japan | 427/443.1 |
| 663753 | 5/1979 | U.S.S.R. | 427/443.1 |

OTHER PUBLICATIONS

Deckert et al, "Improved Post-Pesmear Process . . . ", Printed Circuit WC 111-37, May, 1984.

Primary Examiner—Shrive P. Beck
Assistant Examiner—Vi Duong Dang
Attorney, Agent, or Firm—Robert L. Goldberg

[57] ABSTRACT

A process for the formation of a plated through-hole printed circuit board comprising treating a circuit board base material as follows:

1. condition with an oxidant solution;
2(A). contact with a copper etchant that etches copper and neutralizes oxidant residues on the surface to be plated; and
2(B). contact with a conditioner that conditions the board surface for enhanced catalyst adsorption; or
2(A). contact with a neutralizer for oxidant residues that neutralizes said residues and conditions the board surface for enhanced catalyst adsorption; and
2(B). contact with a copper etchant; and
3. catalyze the board; and
4. plate electroless metal onto catalyzed surfaces from a plating solution containing a source of halide ions in a concentration of at least 0.1 moles per liter of solution.

The process is characterized by the absence of a step of acceleration and contains fewer processing steps than prior art processes.

23 Claims, No Drawings

METAL PLATING PROCESS

BACKGROUND OF THE INVENTION

1. Introduction

This invention relates to a shortened process for electroless metal plating over a substrate and more particularly, to a process for electroless metal plating particularly useful in the manufacture of printed circuit boards.

2. Description Of The Prior Art

When preparing printed circuit boards having more than one circuit pattern, conductive holes, known in the art as through-holes, pass through the board to accommodate insertion and soldering of electrical component leads and to make electrical connections between two or more circuit patterns. Conductive through-holes are conventionally formed by drilling or punching holes through a copper clad, rigid board typically followed by an electroless copper plating procedure. A procedure for the formation of such printed circuit boards is disclosed in U.S. Pat. No. 4,217,182 incorporated herein by reference.

Electroless copper plating procedures used in the formation of printed circuit boards are known in the art and described in numerous publications such as by Coombs Jr. "Printed Circuit Handbook", McGraw-Hill Book Company, New York, N.Y., 1967, Chapter 5, and by Draper, "Printed Circuits and Electronic Assemblies", Robert Draper Limited, Teddington, 1969, Chapter 6, both incorporated herein by reference. The copper clad board with plated through-holes can be processed to printed circuit boards using resists and processes such as those disclosed in the aforementioned "Printed Circuit Handbook" or for example, in any of U.S. Pat. Nos. 3,469,982; 3,526,504; 3,547,730; 3,622,344; and 3,837,860; all incorporated herein by reference.

Printed circuit board failure often occurs as a consequence of poor adhesion of the metal plated onto the sidewalls of the through-holes. There are several causes of poor adhesion. For example, when a through-hole is drilled through the board, a substantial temperature increase occurs at the interface between the drill bit and the wall of the through-hole as a consequence of friction. This results in melting of the plastic substrate at the interface. The melted plastic on the surface of the hole-wall forms a smooth smear over the surface of the hole which is poorly adsorptive of plating catalyst. Another cause of poor adhesion is the presence of minute particles of the plastic formed during the drilling or punching operation. These particles may interfere with the bond between the metal plate and the wall of the through-hole. When a circuit board base material comprising a glass filled epoxy is used as the circuit board base material, the fibrils of the glass fiber often protrude into the hole and interfere with the bond between the subsequently deposited metal and the sidewall of the hole.

An advance in the art of printed circuit board manufacture is the introduction of the multilayer board where multiple circuits are stacked in layers on a circuit board and pressed into a multilayer board. Each circuit is separated from another by a layer of a dielectric material. In a manner similar to the double sided through-hole circuit board, holes are formed in the multilayer stack to form interconnections between the same.

Adhesion of copper to sidewalls of through-holes is more critical in the manufacture of multilayer boards than in the manufacture of two-sided through-hole boards. However, because there are a stack of multiple circuits, through-hole plating is more difficult than through-hole plating of double sided boards and satisfactory and consistent adhesion of the copper to the sidewall is more difficult to achieve.

The basic steps required to cause an electroless metal to deposit on a dielectric surface comprise immersion of the surface into a catalyst composition such as a tin-palladium colloid as disclosed in U.S. Pat. No. 3,011,920. Following catalysis, and a step of acceleration as described in the aforesaid patent, an electroless metal will deposit onto the catalyzed surface. The result is a coherent film of electroless metal over the dielectric surface which for many applications is sufficiently adherent to the dielectric surface. In the manufacture of printed circuit boards, especially in the plating of through-holes, a process comprising only the steps of catalysis and metal plating will not provide a metal deposit with adequate adhesion between the dielectric surface and the deposit. Accordingly, metallization of through-holes in printed circuit board manufacture typically involves a plating line having several steps preceding catalysis and metallization. A plating line in commercial use in the manufacture of plated through-hole printed circuit boards is disclosed in U.S. Pat. No. 4,515,829 incorporated herein by reference. Example 2 of this patent discloses the conventional process which involves ten steps following the step of drilling through-holes though the first step of sulfuric acid treatment is optional. The process provides a circuit board having excellent adhesion between the dielectric surface and the copper.

One object of this invention is to provide a novel plating line for the metallization of dielectric surfaces which is useful in the manufacture of plated through-hole printed circuit boards, utilizes fewer processing steps and is therefore more economical than existing plating lines. Another object of this invention is to provide novel compositions for use in the plating process of the invention.

SUMMARY OF THE INVENTION

The present invention is directed to a process for depositing electroless metal on a dielectric surface and is characterized by fewer processing steps compared to prior art processes. The process is especially useful for the fabrication of plated through-holes printed circuit boards. The invention is predicated in part upon the combination of several processing steps, the elimination of a process step and in part upon the utilization of a novel copper plating solution.

Two alternative processes of the invention, compared to a conventional process of the prior art, comprise the following sequence of steps (where water rinse steps have been omitted):

| Prior Art | Invention (Alt. 1) | Invention (Alt. 2) |
| --- | --- | --- |
| 1. Solvent pretreat | 1. Solvent pretreat | 1. Solvent pretreat |
| 2. Oxidize | 2. Oxidize | 2. Oxidize |
| 3. Neutralize | 3. Etch-neutralize | 3. Condition-neutralize |
| 4. Condition | 4. Condition | 4. Etch |
| 5. Etch | 5. Catalyst pre-dip | 5. Catalyst pre-dip |
| 6. Catalyst pre-dip | 6. Catalyze | 6. Catalyze |
| 7. Catalyze | 7. Metal plate | 7. Metal plate |
| 8. Accelerate | | |
| 9. Metal plate | | |

In the above process sequences, the step of solvent pretreatment in each process shown is optional, but preferred. The steps of solvent pretreatment, catalyst pre-dip, and catalysis in the prior art process and the invention processes are the same.

To obtain the shortened plating sequence outlined above, it is necessary that the electroless plating solution used in step 7 of the invention processes be modified. Consequently, a modified plating solution constitutes a part of this invention.

DESCRIPTION OF THE PREFERRED EMBODIMENTS

The process of the subject invention is useful for the manufacture of printed circuit boards including multilayer circuits, but is especially useful for the formation of double sided through-hole printed circuit boards. For this reason, the following discussion may be considered a specific example of the practice of the invention as applied to the formation of such printed circuit boards and as enabling disclosure thereof.

The manufacture of a printed circuit board begins with a sheetlike base material or substrate clad with copper in a subtractive process or coated with an adhesive layer in an additive process. The substrate material is typically a molded thermoset resin of glass epoxy laminate known in the art as FR4 or G10. An alternative material used for the formation of printed circuit boards is a phenolic base material sold under trade designations AL-910, FR-2, FR-3 and CEM.

Through-holes are formed in the substrate material at the desired locations by any conventional process such as drilling or piercing. The holes are arranged in a prearranged pattern selected by the circuit designer and specified by the user, which in turn is dependent upon the ultimate circuit configuration to be produced.

Following the formation of holes as described above, the board is electrolessly plated. The subject invention is a process for electrolessly plating the board using fewer processing steps than in the prior art processes. A comparison of the process of the invention compared to the prior art process was given above.

The first step in the shortened plating process of the invention, which is optional both to the process of the subject invention and the prior art process, comprises solvent pretreatment. Solvent pretreatment of a plastic comprises contact of a plastic to be plated with a solution of a solvent for the plastic for a time sufficient to deglaze the plastic if necessary, and solvate or soften its surface to facilitate penetration of the surface by subsequently applied treatment chemicals. The specific solvent used in a plating sequence is dependent upon the particular plastic to be plated. Solvent pretreatment chemicals for specific plastics are known in the art and disclosed in numerous patents including U.S. Pat. Nos. 3,574,0070; 3,769,061; 3,795,622; 4,125,649; and 4,315,045; all incorporated herein by reference.

For solvent pretreatment of epoxy resins, the substrate material most often used in processes for the formation of printed circuits, the solvent is preferably an oxygenated epoxy solvent selected from the group of ketones, ethers and ether alcohols. Most preferred solvents include, by way of example, Methyl Cellosolve, Butyl Carbitol, Butyl Carbitol acetate, Butyl Cellosolve and Butyl Cellosolve acetate. The solvent may be used as a 100% solution, but is preferably an alkaline aqueous solution with sufficient water added to decrease the attack of the solvent on the surface of the printed circuit board base material. Preferably, the solvent is diluted with water whereby the solvent comprises from 10 to 70% of the solution and more preferably, from 15 to 40% of the solution. Treatment times and temperatures for the solvent pretreatment step in the plating sequence are the same as in the prior art and typically used at a temperature varying between about 110° and 190° F. for a time varying between about 1 and 10 minutes. A suitable pretreatment solvent av ilable in the marketplace is sold under the tradename Circuposit ® MLB-212 Conditioner and is available from Shipley Company Inc. of Newton, Mass.

The next step in the process sequence of the invention comprises oxidation of the surface of the plastic to activate the same. The step of oxidizing the substrate is the same as in prior art processes. Oxidizing involves contact of a plastic surface with a solution of an oxidizing agent to activate the plastic surface. Two types of oxidizing agents are conventionally used in a metal plating sequence. The oxidizing solutions most frequently used is a chromic acid solutions which may be used in conjunction with sulfuric or phosphoric acid. Such solutions are shown in U.S. Pat. Nos. 3,668,130 and 3,708,430 both incorporated herein by reference. By way of specific example, the substrate is immersed in an oxidizing chromate solution, such as approximately 750 gram/liter of chromic acid at a solution temperature varying between 110° and 160° F. for a time of approximately 30 seconds to 8 minutes. A suitable oxidizing solution available in the marketplace is sold under the tradename PM ® 930, also available from Shipley Company Inc.

The prior art has experienced difficulty in the handling of chrome containing solutions and more recently, the art has used aqueous alkaline permanganate solutions as substitutes for chrome containing solutions. Permanganate oxidizing solutions comprise alkaline solutions of permanganate ions from a source such as potassium permanganate at a pH above 11 and preferably in excess of 13. A permanganate solution together with a process for its use is disclosed in U.S. Pat. No. 4,515,829 incorporated herein by reference. One such solution available in the marketplace is Circuposit ® MLB Promoter 213 available from Shipley Company Inc.

In the conventional prior art process for plating a printed circuit board substrate material, the next three steps in the process typically involve treatment of the substrate with a neutralizer solution, treatment with a conditioner and treatment with an etchant. The three treatments are in separate treatment steps.

In the prior art, treatment with a neutralizer involves contact of the printed circuit board substrate with a solution of a reducing agent to reduce oxidant residues remaining on the surface of the printed circuit board from the prior oxidizing step. Typical reducing agents used in the prior art include aqueous solutions of a hydroxyl substituted lower molecular weight amine or other equivalent reducing agent as taught in the above cited U.S. Pat. No. 4,515,829.

The next step in the prior art process for the manufacture of a printed circuit board involves conditioning. Conditioner solutions typically comprise a surfactant that wets the substrate material and glass fibers of the board to permit uniform catalyzation during the subsequent processing steps. Such surfactant solutions are known in the art and typically comprise mixed cationic surfactants. A suitable conditioner is a proprietary solution sold under the tradename Conditioner 1160 available from Shipley Company Inc.

Following the step of treatment with a conditioning solution, the prior art process would then involve contact of the circuit board substrate with a copper etchant, typically an inorganic persulfate solution or a mild acid solution to mildly etch the copper cladding on one or both sides of the substrate. Etching the copper cladding enhances the bond between the cladding and a subsequently applied electroless copper deposit. Mild acid solutions, such as mineral acids including sulfuric acid, nitric acid, and phosphoric acid, have been used for this purpose. A preferred acid solution is a mineral acid activated with an oxygen release compound such as hydrogen peroxide or another peroxy, persulfate, or perborate compound. Sulfuric acid activated with hydrogen peroxide is a preferred etchant solution in the prior art. A typical etchant of this nature contains from about 0.1 to 3.5 moles per liter of hydrogen peroxide and from about 0.5 to 7.5 moles per liter of sulfuric acid. Such an etchant is disclosed in U.S. Pat. No. 4,419,183 incorporated herein by reference. An etchant conforming to that disclosed in said patent is commercially available from Shipley Company Inc. under the trade designation Preposit ® 746.

It is a discovery of the subject invention that following the procedures described herein, the three prior art steps of neutralizing, conditioning and etching may be combined into two process steps. In accordance with one embodiment of the invention, etching and neutralizing are combined into a single step followed by a step of conditioning. In accordance with a second embodiment of the invention, the steps of neutralizing and conditioning are combined into a single step followed by a step of etching.

The combined steps of neutralizing and etching in accordance with the first embodiment of the invention is based upon the use of a mineral acid solution activated with hydrogen peroxide, such as the formulations disclosed in U.S. Pat. No. 4,419,183 referenced above, though the addition of tungsten or molybdenum as disclosed in said patent is optional. In this respect, acidic peroxide solutions, though normally considered to be oxidants, exhibit reducing capability when used to treat oxidant residues remaining on the surface of a printed circuit board and accordingly may be used as a neutralizer for removing oxidant residues. The commercially available sulfuric acid-hydrogen peroxide etchant marketed under the trade designation Preposit ® 746 referenced above is suitable for the combined steps of neutralizing and etching.

Following the step of treatment with the combined neutralizer—etchant, a standard conditioner or cleaner conditioner is used to enhance catalyst adsorption on the surface of the board. This is in accordance with prior art procedures. Conditioners described above, such as Conditioner 1160, are suitable for this purpose.

In the second embodiment of the invention, the steps of neutralizing and conditioning are combined. The combined neutralizer—conditioner solution in accordance with the second embodiment of the invention involves treatment with a conventional reducing or neutralizing agent as described in the prior art to which a cationic surfactant, or combination of surfactants, is added. A typical solution could comprise an acid solution of a hydroxyl substituted lower molecular weight amine, or other equivalent reducing agent as taught in the above cited U.S. Pat. No. 4,515,829, to which a cationic surfactant is added. A mineral or equivalent acid may be used as the source of acidity. A suitable combined neutralizing and conditioning solution would have a formulation as follows:

Hydroxyl Amine Complex—1 to 25 grams per liter
Surfactant[1]—1 to 50 grams/liter
Sulfuric Acid—to pH below 1
Water—to 1 liter

[1]Polymeric acrylamide cationic surfactant.

Following treatment with the combined neutralizer conditioner solution, the printed circuit board base material is treated with a conventional copper etchant following prior art procedures and using prior art solutions as described above.

The step of catalysis renders the surface of the substrate catalytic to electroless metal deposition. The step of catalysis in accordance with the process of the invention comprises two steps compared to a three-step process used by the prior art. In accordance with the invention, the first two steps of the process are the same as in the prior art and involve treatment with a catalyst pre-dip solution followed by contact with an electroless plating catalyst solution. Following catalyst pre-dip and catalysis, the process of the invention departs from the prior art process by omission of the conventional step of acceleration prior to electroless plating.

Conventional catalyst pre-dip involves immersion of the circuit board base material in an aqueous acid solution of halide ions. The acid most commonly used in such pre-dip solutions is hydrochloric acid or sulfuric acid used in a concentration of from about 1 to 5%. The halide ions are typically chloride ions, most often derived from sodium chloride. Chloride content is typically from 50 to 250 grams per liter of solution. A substrate is immersed in a pre-dip solution at a temperature ranging between 50° and 120° F. for a period of time ranging between 1 and 5 minutes. A commercially available catalyst pre-dip solution is available from Shipley Company Inc. under the trade designation Cataprep ®404.

The step of catalysis comprises immersion of the substrate in a solution of a metal catalytic to electroless metal deposition. One catalyst in commercial use is a tin palladium colloidal suspension in an aqueous acid solution. A catalyst of this nature is more fully described in U.S. Pat. No. 3,011,920 referenced above. Palladium is the catalytic metal and is present in aqueous media in an amount typically varying between 0.03 and 1.5 grams per liter of solution. The aqueous media is typically acidified with hydrochloric or sulfuric acid in sufficient concentration to provide a pH not exceeding 1.0. A source of halide ions, typically chloride ions, is often added to the catalyst solution to increase halide ion content to a level in excess of that provided by other constituents of the catalyst solution. A part is immersed in a catalyst for a time sufficient to adsorb sufficient palladium whereby electroless metal deposits over the entire catalytic surface to be plated. Immersion time in the catalyst typically ranges from about 3 to 10 minutes with the catalytic solution maintained at a temperature varying between room temperature and about 150° F. Palladium catalysts are commercially available from Shipley Company Inc. under the trade designations Catalyst 6F and CATAPOSIT ®44.

In the prior art, following catalysis, the part is treated with an accelerator to remove adsorbed tin and thereby activate the catalytic palladium metal. The accelerator is usually an acid solution. In accordance with the subject invention, the step of acceleration may be omitted due to the use of a novel copper plating solution described below.

The next step in the processing sequence involves deposition of an electroless metal. The metal used in circuit manufacture is most often copper. Electroless copper deposition involves the reduction of copper ions in solution to metallic copper when the copper ion is in contact with a catalytic surface. A copper deposition solution typically comprises four ingredients dissolved in water. These ingredients are (1) a solution soluble copper salt as a source of cupric ions (2) a complexing agent to hold the copper ions dissolved in solution, (3) a reducing agent such as formaldehyde to reduce the copper to metallic form and (4) a pH adjustor to provide an alkaline solution. Copper deposition solutions are disclosed in U.S. Pat. Nos. 3,765,936, 3,846,138, and 4,124,399, all incorporated herein by reference.

The copper salt is usually a solution soluble salt of copper such as copper sulfate, copper chloride, copper nitrate, etc. Copper sulfate is the salt of choice in most commercial formulations. Copper (as metallic copper) is typically present in solution in an amount of from 1 to 3 grams per liter. Copper is held in solution by a complexing agent for the copper. Typical complexing agents are described in the aforesaid patents. Hydroxyalkyl substituted tertiary amines are preferred complexing agents. Tetra hydroxyl propylethylene diamine or ethylene diamine tetraacetic acid salts or similar compounds are preferred complexing agents. The reducing agent for copper is typically formaldehyde, a borane or a hypophosphite. Formaldehyde is the reducing agent of choice for most commercial applications. The reducing agent is present in excess of the copper and typically present in a stoichiometric excess of at least 2 moles of reducing agent per mole of copper. Hydroxide is the typical pH adjuster for the plating solution and is present in an amount sufficient to provide a pH of at least 10 and preferably, a pH varying between about 11 and 13. Electroless copper plating solutions also include other additives such as brighteners, stabilizers, grain refiners, etc. as is known in the art and disclosed in the above cited patents.

An electroless copper plating solution is used at a temperature varying between room temperature and about 160° F., dependent upon the specific formulation used. A catalyzed part is immersed in the copper plating solution for a time sufficient to deposit copper to a desired thickness. This time can vary from between 5 minutes and several hours. Electroless copper plating solutions are commercially available from Shipley Company Inc. under the trade designation CUPOSIT® CP-70, Cuposit® CP-251 and CUPOSIT® CM-328.

The copper plating solutions used for purposes of this invention have formulations corresponding to those described above, but in addition, contain halide ions in an amount in excess of that which would be provided from other solution components. The halide ions in excess of those from other solution components are from an extraneous source of halide ions added to solution. Hence, the term "extraneous source of halide ions", or similar expression as used herein, means halide ions from a source other than the principal solution components—i.e., from a source other than the copper salt, complexing agent, reducing agent and pH adjuster. By way of illustration, if cupric chloride were used as the source of cupric ions and total copper content was within the range of 1 to 3 grams per liter (expressed as the metal), chloride ion content from the cupric salt would range from about 0.03 to 0.09 moles per liter of solution. This would be inadequate for purposes of the subject invention.

The total halide concentration in the copper plating solution should be at least 0.1 moles per liter of solution and preferably should vary from about 0.3 to 3.0 moles per liter of solution. The most preferred concentration range for the halide ions varies between about 0.5 and 1.5 moles per liter of solution. The most preferred halide ion is the chloride ion.

It should be understood that a portion of the halide ion concentration may be derived from solution components such as a copper halide salt used in the make up of the plating solution. However, halide ion concentration from solution components alone without extraneous halide ions would provide an insufficient concentration of halide ions for purposes of the invention.

The extraneous source of halide ions may be obtained from any suitable halide salt that does not adversely affect the performance of the plating solution. Alkali and alkaline earth metal salts of halides are preferred and sodium chloride constitutes the most preferred source of halide ions for purposes of this invention. Special procedures for adding the halide salt to the copper plating solution are not required.

Following plating of a printed circuit board substrate material in accordance with the generalized procedures set forth above, the printed circuit board is completed using fabrication procedures standard in the art.

The invention will be better understood by reference to the examples which follow. In the examples, Example 1 represents the most preferred embodiment of the invention. In all examples, test panels of a glass reinforced copper clad epoxy material were used. This material is sold under the tradename di-clad FR4 and is available from Norplex Corporation. The test panels were cut to a size measuring 3 by 4 inches and had through-holes drilled through the board at desired locations.

EXAMPLE 1

A test panel as described above was processed in accordance with the following sequence of steps:

Step 1—Immerse in an aqueous solution of an organic solvent identified as Circuposit® MLB Conditioner 212[a] for 5 minutes at a temperature of 140° F. and water rinse;

Step 2—Immerse in a conditioning solution identified as Circuposit® MLB Promoter 214[b] for 5 minutes at a temperature of 180° F. and water rinse;

Step 3—Immerse in a combined neutralizer etch solution[c] for 2 minutes at a temperature of 110° F. and water rinse;

Step 4—Immerse in an aqueous solution of a cleaner conditioner identified as Cleaner Conditioner XP.5529-1[d] for 5 minutes at a temperature of 140° F. and water rinse;

Step 5—Immerse in an aqueous solution of a catalyst pre-dip identified as Cataprep® 404[e] for 2 minutes at a temperature of 85° F. and water rinse;

Step 6—Immerse in an aqueous solution of a catalyst identified as Cataposit® 44[f] for 4 minutes at a temperature of 110° F. and water rinse;

Step 7—Immerse in an aqueous electroless copper plating solution identified as Cuposit® 251[g] to which 40 grams per liter of sodium chloride have been added during solution make-up for 30 minutes at a temperature of 115° F. and water rinse.

[a] Oxygenated solvent system comprising Butyl Carbitol.
[b] Alkaline permanganate solution having a pH of about 13.2.
[c] Solution comprising 3 Normal sulfuric acid activated with hydrogen peroxide.
[d] Surfactant solution comprising a mixture of cationic and non ionic surfactants.
[e] Hydrochloric acid solution containing 220 grams per liter of sodium chloride.
[f] Tin palladium colloid with a palladium content of 0.14 grams per liter.
[g] Copper sulfate solution complexed with ethylene diamine tetraacetic acid using formaldehyde as a reducing agent in a concentration of 10 grams per liter of solution at a pH of 12.8.

Following the above plating sequence, the part was examined and found to have an adherent electroless copper deposit over its entire surface. The part was then subjected to a backlight test. This test involves cutting a piece of the board using a diamond saw to prepare a 1"×⅛" strip with one cut going through the center of a row of holes whereby one-half of the surface of the hole sidewalls is visible when viewed from the edge of the board. The sample so prepared is placed under a microscope with the optics focused on the exposed sidewalls of the holes. The microscope used was an an Olympus BHMJL scope containing a 50 watt light source and possessing a 50× magnification. Light is passed through the opposite edge of the sample. The board is sufficiently translucent through its ⅛" cross sectional dimension to permit light to pass through any voids present in the electroless copper coating over the sidewalls of the holes. The board is then evaluated using test results based upon a numerical scale ranging from 0 to 5 where 0 represents no metal coverage, 5 represents complete coverage with no light visible when viewed through the microscope and numbers between 0 and 5 represent results varying from poor at 0 to excellent at 5. Using these procedures, the part was determined to have a rating varying between 4.75 and 5.

The balance of the part was then used to determine peel strength between the metal plate and substrate. This was determined by a standard tape test. It was found that no copper was removed from the circuit board surface when the tape was peeled from the copper.

Following the tape test, the part was electroplated with copper to a thickness of 1 mil and immersed first in solder flux to wet its surface, then in molten solder at 500° F. for 10 seconds. The part was then micro sectioned using standard industry methods and examined. Good integrity of the copper to copper bond was seen on all surfaces.

EXAMPLE 2

The procedure of Example 1 was repeated, but the steps identified as steps 3 and 4 above were reversed. Adhesion of the electroless copper deposit was satisfactory as determined by a tape peel test and the solder immersion test. Coverage of the hole wall surfaces was reduced to from 3.0 to 3.5 as determined by the back light test.

EXAMPLE 3

The procedure of Example 1 was repeated but sodium chloride addition was omitted from the copper plating solution. The backlight rating for the coated sample remained at between 4.75 and 5.0, but peel strength between the copper and the substrate was poor as 50 to 75% of the electroless copper deposit peeled from the board surface using the standard peel test. Gross separation of copper from substrate copper was found when an electroplated part was subjected to a solder shock test.

EXAMPLE 4

The procedure of Example 1 was repeated except that steps 3 and 4 above were replaced by the following alternative steps:

Step 3 (alt.)—Immerse in an aqueous solution of a hydroxyl amine based neutralizer conditioner[a] for 5 minutes at a temperature of 120° F. and water rinse;

Step 4 (alt.)—Immerse in an aqueous solution of an etchant identified as Preposit Etch 746[b] for 2 minutes at a temperature of 110° F. and water rinse.

[a] 1N Sulfuric acid solution containing hydroxyl amine nitrate in an amount of 10 grams per liter and polyacrylamide cationic in an amount of 25 grams per liter.
[b] Solution comprising 3N sulfuric acid activated with hydrogen peroxide.

A good backlight rating of 4.25 to 4.5 was obtained. Adhesion was tested using the tape test and solder shock test of Example 1. Good adhesion was observed in both tests.

EXAMPLE 5

The procedure of Example 4 was repeated omitting sodium chloride from the copper plating solution. A good backlight rating of 4.25 to 4.5 was obtained. However, when adhesion was tested using the tape test, 50 to 75% of the electroless copper deposit peeled from the board surface onto the tape after peeling back of the tape. Another section of the part was electroplated, solder shocked, and micro-sectioned as in Example 1. Gross separation of the electroless copper from the substrate copper was observed.

EXAMPLE 6

The procedure of Example 4 was repeated except that step 4a was replaced by the following:

Step 4 (alt.)—Immerse for 2 minutes at a temperature of 70° F. in an aqueous solution of a persulfate etchant consisting of 120 gram per liter sodium persulfate to which 10 ml per liter of concentrated sulfuric acid is added and water rinse.

For this example, a good backlight rating of 4.25 to 4.5 was obtained. Adhesion was tested using the tape test and solder shock test of Example 1. Good adhesion was observed in both tests.

EXAMPLE 7

The procedure of Example 6 was repeated without the addition of the sodium chloride to the copper plating solution. A good backlight rating of 4.25 to 4.5 was obtained. Adhesion was tested using the tape test and solder shock test of Example 1. It was found that 50 to 75% of the electroless copper peeled from the board surface onto the tape. In the solder shock test, gross separation of the electroless copper from the substrate copper was observed.

We claim:

1. A process for electrolessly plating metal onto a copper clad circuit board base material, said process comprising the principal steps of:
   a. oxidizing the surface to be plated;
   b. neutralizing oxidant residues resulting from oxidation, conditioning the surface with a surfactant to enhance adsorptivity of the surface and etching the copper portions of the surface, the steps of neutralizing, conditioning and etching being conducted in two processing steps;

c. catalyzing the surface to be plated with a metal catalytic to electroless metal deposition; and d. plating electroless metal onto the surface from an electroless plating solution characterized by halide ions in solution in a concentration of at least 0.1 moles per liter of solution where at least a portion of said halide ions are from a source other than the source of the plating metal.

2. The process of claim 1 where the steps of neutralizing, conditioning and etching comprise a first step of contact with a solution that simultaneously neutralizes and etches and a second step of contact with a solution that conditions.

3. The process of claim 1 where the steps of neutralizing, conditioning and etching comprise a first step of contact with a solution that simultaneously neutralizes and conditions and a second step of contact with a solution that etches.

4. The process of claim 2 where the solution to neutralize and etch is a mineral acid solution activated with a peroxy compound.

5. The process of claim 4 where the solution is a sulfuric acid solution activated with hydrogen peroxide.

6. The process of claim 3 where the solution to neutralize and condition is a solution containing a reducing agent and a surfactant.

7. The process of claim 6 where the solution comprises an amine reducing agent and a cationic surfactant.

8. The process of claim 1 characterized by the absence of a step of acceleration.

9. The process of claim 1 where the plating metal is copper.

10. The process of claim 1 where the halide ion in the electroless plating solution is chloride ion.

11. The process of claim 10 where the halide ions are chloride ions in a total concentration of from 0.3 to 3.0 moles per liter of solution.

12. The process of claim 10 where the halide ions are chloride ions in a concentration varying between 0.5 and 1.5 moles per liter of solution.

13. The process of claim 1 where the surface to be plated is a circuit board base material having through-holes between surfaces.

14. The process of claim 13 where the circuit board base material is copper clad epoxy.

15. The process of claim 2 where the conditioner is a cationic surfactant containing solution.

16. The process of claim 3 where the etchant is a mineral acid solution activated with hydrogen peroxide.

17. The process of claim 16 where the mineral acid is sulfuric acid.

18. The process of claim 1 where the step of catalysis involves a step of treatment with a catalyst pre-dip followed by catalysis.

19. The process of claim 18 where the catalysis pre-dip solution is a solution of halide ions.

20. The process of claim 1 where the catalyst is a palladium tin catalyst.

21. The process of claim 1 including a step of solvent pretreatment as an initial step in the sequence.

22. A process for electrolessly plating copper onto the surface of a copper clad circuit board base material, said process comprising the steps of:

a. treating the surface with a solution of a solvent for the circuit board base material;

b. treating the surface with a solution of an oxidant;

c. treating the surface with a solution that neutralizes oxidant residues and simultaneously etches copper;

d. treating the surface with a solution that conditions the surface to enhance adsorption of subsequently applied catalyst;

e. treating the surface with an electroless plating catalyst; and f. electroless plating copper over the catalyzed surface from a copper plating solution containing a total chloride content of at least 0.1 moles per liter of solution.

23. A process for electrolessly plating copper onto the surface of a copper clad circuit board base material, said process comprising the steps of:

a. treating the surface with a solution of a solvent for the circuit board base material;

b. treating the surface with a solution of an oxidant;

c. treating the surface with a solution that neutralizes oxidant residues and simultaneously conditions the surface to enhance adsorption of subsequently applied catalyst;

d. treating the surface with a solution that etches copper;

e. treating the surface with an electroless plating catalyst; and f. electroless plating copper over the catalyzed surface from a copper plating solution containing a total chloride content of at least 0.1 moles per liter of solution.

* * * * *